(12) United States Patent
Eikenbroek

(10) Patent No.: US 7,274,276 B2
(45) Date of Patent: Sep. 25, 2007

(54) AMPLIFIER CIRCUIT, GYRATOR CIRCUIT, FILTER DEVICE AND METHOD FOR AMPLIFYING A SIGNAL

(75) Inventor: Johannes Wilhelmus Theodorus Eikenbroek, Emmen (NL)

(73) Assignee: Telefonktiebolaget LM Ericsson (publ), Stockholm (SE)

( * ) Notice: Subject to any disclaimer, the term of this patent is extended or adjusted under 35 U.S.C. 154(b) by 182 days.

(21) Appl. No.: 10/516,631

(22) PCT Filed: Jun. 3, 2002

(86) PCT No.: PCT/NL02/00359

§ 371 (c)(1),
(2), (4) Date: Dec. 1, 2004

(87) PCT Pub. No.: WO03/103135

PCT Pub. Date: Dec. 11, 2003

(65) Prior Publication Data

US 2005/0179509 A1 Aug. 18, 2005

(51) Int. Cl.
*H03H 11/00* (2006.01)
*H03H 11/16* (2006.01)

(52) U.S. Cl. ............... 333/215; 327/237; 327/246
(58) Field of Classification Search ............... 333/215, 333/216, 217
See application file for complete search history.

(56) References Cited

U.S. PATENT DOCUMENTS 4,459,555 A   7/1984 Jett, Jr.
5,006,823 A * 4/1991 Baril et al. ............... 333/164
6,084,469 A   7/2000 Lorenz
6,597,899 B2 * 7/2003 Souetinov et al. .......... 455/323

OTHER PUBLICATIONS

Danyuk D L et al: "The Design of a Correction Circuit for Sectional Low-Noise Amplifiers", Telecommunications and Radio Engineering, Begell House, Inc., New York, NY, US, vol. 46, No. 12, Dec. 1, 1991, pp. 98-100, XP000311651, ISSN: 0040-2508, p. 98-p. 99.
European Patent Office, International Search Report for PCT/NL02/00359, dated Mar. 6, 2003.

* cited by examiner

Primary Examiner—Robert Pascal
Assistant Examiner—Kimberly E Glenn
(74) Attorney, Agent, or Firm—Michael Cameron

(57) ABSTRACT

An amplifier circuit comprising a transconductor device connected to a phase shifter section. The phase shifter section has an adjustable phase shift and an impedance at least partially dependent of the frequency of an input signal. In use, the adjustable phase shift is adjusted to have substantially the opposite value of a phase shift of the transconductor device. In an embodiment, the phase shifter section comprises a capacitor device and an adjustable resistor device which comprises an amplifier device with an input contact for receiving a resistance control signal; a first output contact connected to the capacitor devices and a second output contact connected to the transconductor device. The amplifier circuit further comprises a control device for providing said resistance control signal to the input contact of the amplifier device.

13 Claims, 4 Drawing Sheets

AMPLIFIER CIRCUIT, GYRATOR CIRCUIT, FILTER DEVICE AND METHOD FOR AMPLIFYING A SIGNAL

The invention relates to an amplifier circuit at least comprising one transconductor device connected to at least one phase shifter section having an adjustable phase shift and an impedance at least partially dependent of the frequency of an input signal.

The invention further relates to circuits and devices at least comprising such an amplifier circuit, e.g. a gyrator device and a filter circuit.

Amplifiers may be implemented in for example integrators and capacitors used in integrated IF-filter devices. It is known, for example from Rudy J. van de Plassche, Willy M. C. Sansen, Johan H. Huijsing, *"Analog circuit design, low-power low-voltage, integrated filters, smart power"*, 1994, ISBN 0-7923-9513-1, to implement transconductance amplifier devices and capacitors to obtain desired transfer characteristics of a filter device. A transconductance amplifier device may f.e. be used to realise the terminal impedances of the filter device. Additionally, two transconductance amplifier devices may be used as a gyrator, that is, an electronic device having an input impedance proportional to the inverse of the load impedance. Therefore, if the output of a gyrator is connected to a capacitor, i.e. if the load impedance is a capacitance, the input impedance behaves like an inductance. Thus, such a gyrator-capacitor circuit has the characteristics of an inductor, and has as an impedance which is dependent on the frequency. Use of this feature is especially useful in integrated circuit technology where it is difficult and expensive to realise physical inductors.

However, a problem is that transconductance amplifier devices exhibit frequency-dependent transfer characteristics. This may cause a deviation of the characteristics of the gyrator device or the filter device in which such a transconductance amplifier device is used, from the ideal characteristics. Also, in a filter device the frequency dependence of the performance of the amplifier device influences the attenuation of frequencies outside the desired frequency pass band of the filter and might even cause an instable filter-system.

Furthermore, in a poly-phase filter the image-rejection properties of a polyphase IF-filter are ultimately determined by matching-properties between the circuits in the branches with different phases. This matching may be obtained in Complementary Metal Oxide Semiconductor (CMOS) topologies by using transistors occupying an area as large as possible. The frequency dependence of the transconductance amplification of the transistors depends heavily on their lengths because the cut-off frequency of the transconductance is inversely proportional with the transistor-length squared. Therefore, a compromise is required between image-rejection properties (set by the matching properties) and pass band tilt and/or stability (determined by the excess phase shift of the transconductance stages) of the gyrator device or the filter device.

A similar problem exists for transconductance amplifier devices in a bipolar topology. For a bipolar transistor, the unwanted frequency dependence of the amplifier is caused by the non-zero resistance of the base. The presence of the base resistance introduces a frequency-dependent behaviour between the external base-emitter voltage and the internal base-emitter voltage to which the gain of the transistor is proportional. As far as matching is concerned for the bipolar transistor, matching properties will be better for large transistor areas. Although the time-constant, which is equal to the product of the base resistance and the equivalent input capacitance is roughly independent from scaling, the influence of the base-emitter junction capacitance increases for a given collector-current if the transistor is scaled to a larger version. Consequently, this results in more excess phase shift in the transconductance gain for a given frequency. Therefore, also for bipolar devices a compromise has to be found between high frequency behaviour and matching properties.

The invention seeks to solve, or at least alleviate, the described problems. It is therefore a goal of the invention to provide an amplifier circuit having an improved frequency independent transfer characteristic. Therefore, according to the invention an amplifier device as described above is characterised in that, that in use said adjustable phase shift is adjusted to have substantially the opposite value of a phase shift of said transconductor device.

Because of the adjustable phase shift, the phase shift of the integrator may be set to compensate for the frequency dependent phase shift of the transconducor device. Thereby the amplification of an amplifier will become substantially independent of frequency and the tilt in the passband of a filter may be compensated.

Furthermore, stability problems can be avoided because the compensating adjustable phase shift counteracts the shift of the poles of the filter to the Right Half Plane (RHP) which is caused by the excess phase shift. Also, there is less trade-off between the image-rejection requirements and the stability-requirements of the filter because larger transistor sizes for better matching properties may be used without deteriorating the stability of the filter. Furthermore, if an automatic tuning system (ATS) is used, the time constant tuning system thereof may be combined with the already available frequency-tuning system of the filter device. The power-consumption required for this compensation is very low, so a better performance is obtained at the same level of power consumption.

Specific embodiments of the invention are set forth in the dependent claims.

Further details, aspects and embodiments of the invention are described below with reference to the figures in the attached drawing.

Figure 1:
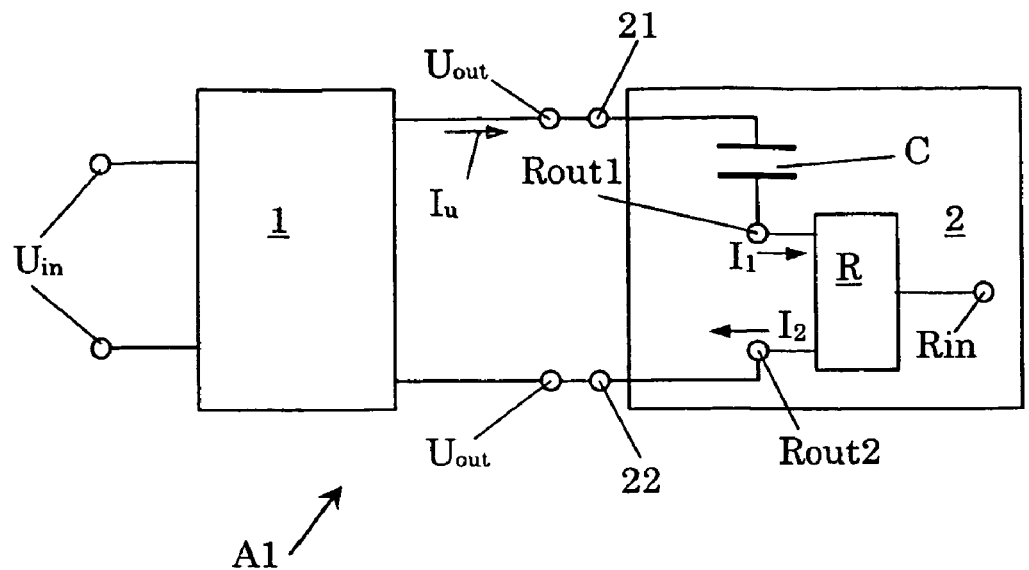
FIG. 1 shows a block diagram of an example of an embodiment of an amplifier circuit according to the invention, wherein an amplifier is used as an adjustable resistor.

The expressions resistor and capacitor as used herein at least comprise any device or element having mainly resistive or capacitive properties. FIG. 1 shows an electric circuit of an example of an embodiment of an amplifier circuit A1 according to the invention. The amplifier circuit comprises a transconductor device 1 having two input contacts Uin and two output contacts Uout. In general, a transconductor device outputs a current at the output contacts based on the voltage of an input signal. The transconductor device 1 is connected with its output contacts Uout to a phase shifter section 2. The phase shifter device 2 comprises an adjustable resistor R and a capacitor C connected in series and connected in parallel to the output contacts Uout of the transconductor device 1.

The adjustable resistor R is an amplifier device R which may be tuned to a certain resistance. The amplifier device R has an input contact Rin and two output contacts, Rout1 and Rout2 resp. At the output contacts a current $I_1$, $I2$ resp. is provided in the direction indicated with the arrows $I_1$, $I2$. Usually, the currents $I_1,I_2$ are equal. By applying a certain input signal at the input contact Rin, the output signal at the output contacts Rout1, Rout2 is controlled, resulting in a certain impedance between the output contacts. Thus the impedance may be changed by changing the input signal.

The transconductor device 1 outputs an output current based on a voltage difference between the input contacts. The output current may mathematically be approximated as:

$$I_u = g_m \cdot U_i \qquad (1).$$

In this equation, $I_u$ represents the output current in the direction indicated with the arrow $I_u$, in FIG. 1, $U_i$ represents the voltage applied over the input contacts $U_{in}$, and $g_m$ represents the gain of the transconductor device 1.

The gain of a transconductance amplifier is generally dependent on the frequency of the signal presented at the input contacts and may be approximated as $g_m = g_0/(1+j\omega\tau)$, wherein $g_0$ represents the transconductance of the transconductor device for a signal having a frequency of substantially 0 Hz, $\omega$ represents the frequency of the input signal multiplied by $2\pi$, j is the square root of $-1$ and $\tau$ is the time constant of the transconductor. The voltage-transfer of the amplifier circuit shown in FIG. 1 may be described by the following mathematical formula:

$$\frac{U_o}{U_i} = g_m\left(\frac{1}{jwC} + R\right) = \frac{g_0}{1+jw\tau} \cdot \frac{1+jwRC}{jwC} \qquad (2)$$

In equation (2), $U_i$ and $U_o$ represent the voltage differences between the input contacts resp. the output contacts of the transconductor device 1; R represents the resistance of the amplifier device R and C represents the capacitance of the capacitor C in FIG. 1.

The phase shifter device 2 has a phase shift $\Delta\phi$ between the voltage over a first shifter contact 21 and a second shifter contact 22 and the current flowing through the shifter contacts. The relation between the voltage $U_o$ over the shifter contacts 21,22 and the current $I_u$ may mathematically be described as:

$$\frac{U_o}{I_u} = \frac{1+jwRC}{jwC} \qquad (3)$$

In this equation C represents the capacitance of the capacitor C, j is the square root of $-1$, $\omega$ represents the frequency and $I_u$ is defined in the direction indicated with arrow $I_u$ in FIG. 1 and R represents the resistance of the amplifier device R.

As explained, the resistance of the amplifier device R over the output contacts Rout1,Rout2 may be controlled by the signal applied at the input contact Rin. Thereby the phase shift of the phase shifter section 2 is adjustable too. The capacitor C may also be adjustable and may for example be a varactor device. Because of the adjustable resistance and/or capacitance the phase shift may be set to compensate for the phase-shift and/or frequency dependence of the gain of the transconductor device 1.

Thereby, the time constant of the phase shifter device, that is the product of the resistance and the capacitance may easily be adjusted such that the time constant R*C is substantially equal to the time constant $\tau$ of the transconductor device 1. The resulting overall transfer of the amplifier circuit A1 may then be described by the mathematical formula:

$$\frac{U_o}{U_i} = \frac{g_0}{jwC} \qquad (4)$$

This is the behaviour of an ideal integrator.

The amplifier input may be connected to a control device in which the characteristics of the transconductor device are modelled. This control device may then provide a signal to the amplifier device, such that the amplifier compensates for the changes in the transconductance, as is explained above.

The amplifier device may be substantially similar or equal to the transconductor device. Thereby, the characteristics of the amplifier device and the transconductor device will have substantially the same dependencies. So no extra means are required to compensate for changes due to for example a change in temperature.

The amplifier device in the resistor may for example be a transistor device such as a Field Effect Transistor (FET). It should be noted that in this application the term 'amplifier' is understood to comprise all transistors. If the adjustable resistor is a transistor device, the amplifier circuit may be implemented as a single integrated circuit. This is especially suited, if the transistor is of the same type as the transistors used in other devices in the integrated circuit, such as the transistors in the transconductor device. In this case, the processing of the integrated circuit is less complex because the devices in the integrated circuit require substantially the same processing.

FIGS. 2-6 show examples of a capacitor C connected to a transistor R used as an adjustable resistor device. In these figures a field effect transistor (FET) is used as a adjustable resistor, however other types of transistors may also be used. The resistor contacts Rout1, Rout2 are the drains and sources of the FETs. The resistance of the FET may be adjusted by changing a voltage applied to the gate Rin, Rin1, Rin2 of the FETs with respect to the substrate of the devices. Thereby the conducting channel in the FET between the source and drain is widened or tightened, resulting in a lower or higher resistance of the FET between the source and drain. Since the drain-source connections are in series with a capacitor, no DC-current will flow through the resistor and the power-consumption will be substantially zero, or at least very low In FIGS. 2-6 the voltages over the source, drain and gate of the FETs are set such that the transistors operated in the triode region.

Figure 2:
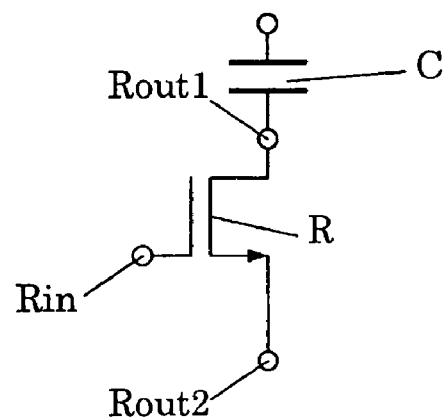
FIGS. 2-6 show electric circuits of examples of capacitor-resistor circuits wherein a transistor is used as an adjustable resistor.
Figure 3:
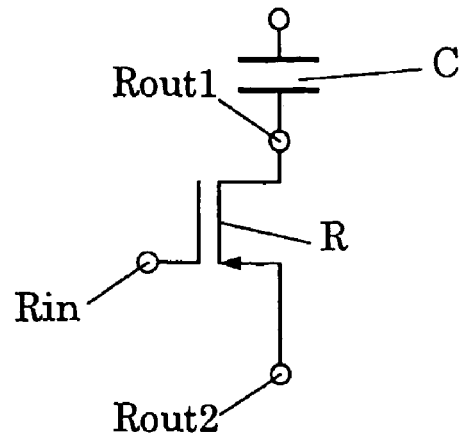
Figure 4:
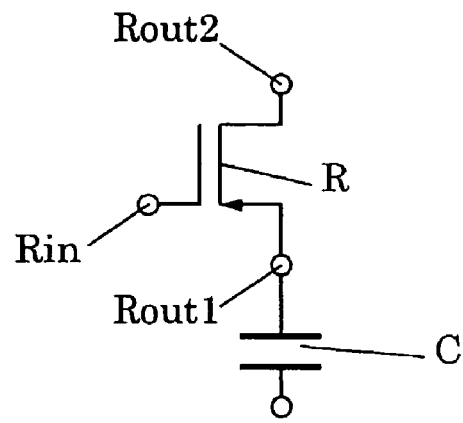
Figure 5:
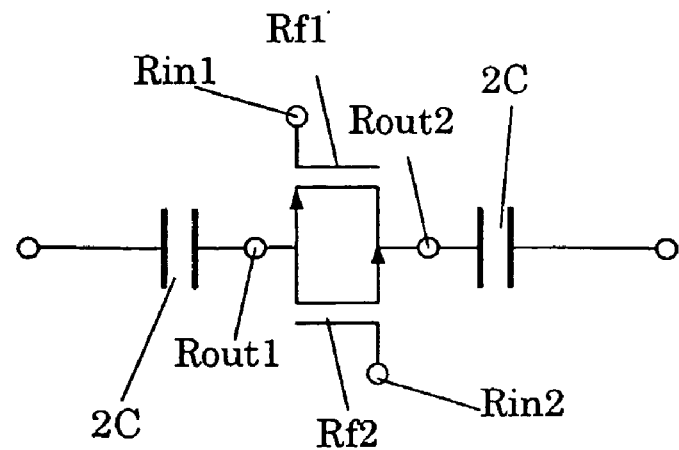
Figure 6:
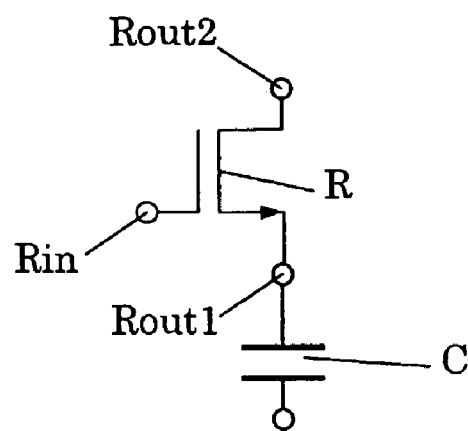

In FIGS. 2 and 6 an n-type FET is used as a resistor and in FIGS. 3 and 4 a p-type FET is used. In FIG. 5 a complementary FET is used. The complementary FET comprises a p-type FET RF1 and a n-type FET RF2 connected in anti-parallel to each other. In FIG. 5 each of the sources and drains of the FETs is connected to a capacitor with a capacitance of 2C. In FIGS. 2-6, the FETs may for example be replaced with another amplifier device. The resistance of the amplifier device may then be adjusted by changing the voltage or current applied to input of the amplifier device.

Figure 7:
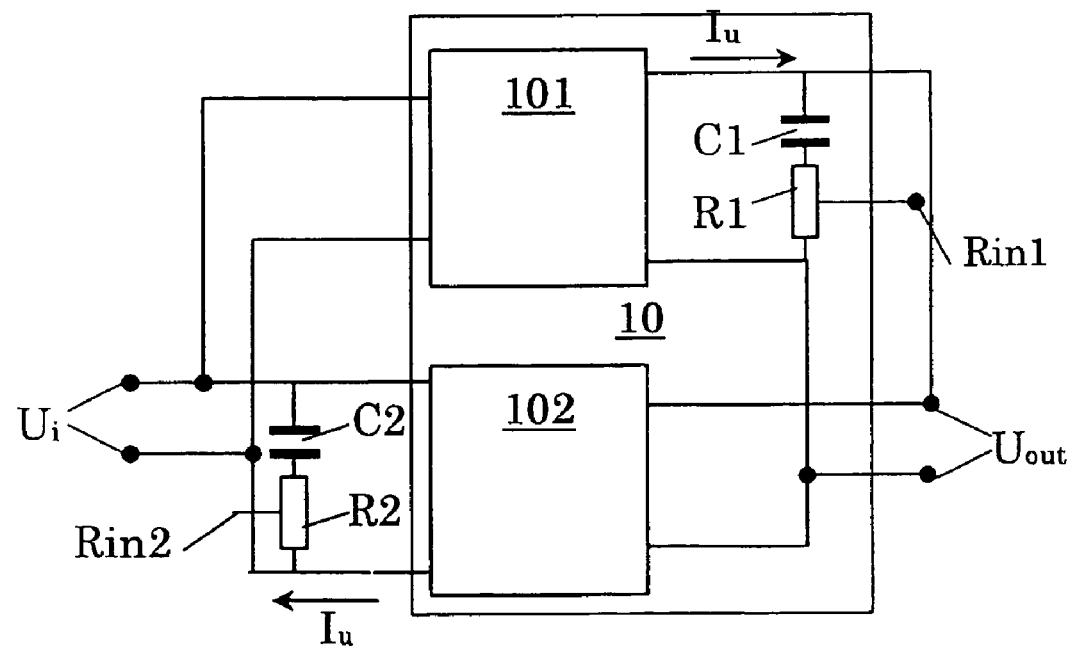
FIG. 7 shows an electric circuit of an example of an embodiment of a gyrator device according to the invention.

FIG. 7 shows a gyrator device 10 including amplifier circuits according to the invention. The gyrator device 10 has an input $U_{in}$ and an output $U_{out}$. The gyrator comprises two transconductance amplifiers 101,102 head-tail connected to each other. The gain of amplifier 102 is opposite to the gain of amplifier 101, that is the amplifier 102 outputs a current in a direction opposite to the direction of an output current of the amplifier 101 if an input signal is applied at the input contacts $U_i$, as is indicated in FIG. 7 with arrows $I_u$.

In the gyrator, the amplifiers 101,102 are connected to a phase shifter device comprising a capacitor $C_1$ and a resistor $R_1$ connected in series. The resistor R1 is an adjustable resistor and may for example be a FET connected to a capacitor or an amplifier as explained above with reference to FIGS. 1-6.

If the resistances of the resistor R1 is set such that the time constant $R_1 * C_1$ is substantially equal to the time constant $\tau$ of the transconductors 101-102, the impedance of the gyrator is equal to the impedance of an ideal inductor times the gain of the amplifiers. The gain of the amplifiers may also be opposite and inverse to each other. In this case, the amplifier 102 outputs a current having an amplitude substantially equivalent to one over the amplitude of output current of the amplifier 11, in which case the gyrator has the impedance of an ideal inductor. Connected to the input contacts $U_i$ of the gyrator 10 is an RC-circuit comprising a resistor R2 and a capacitor C2 connected in series. Thus the impedance of the circuit in FIG. 7, seen at the input contacts $U_i$ is virtually equal to the impedance of an ideal inductor and an ideal capacitor in parallel to each other.

Figure 8:
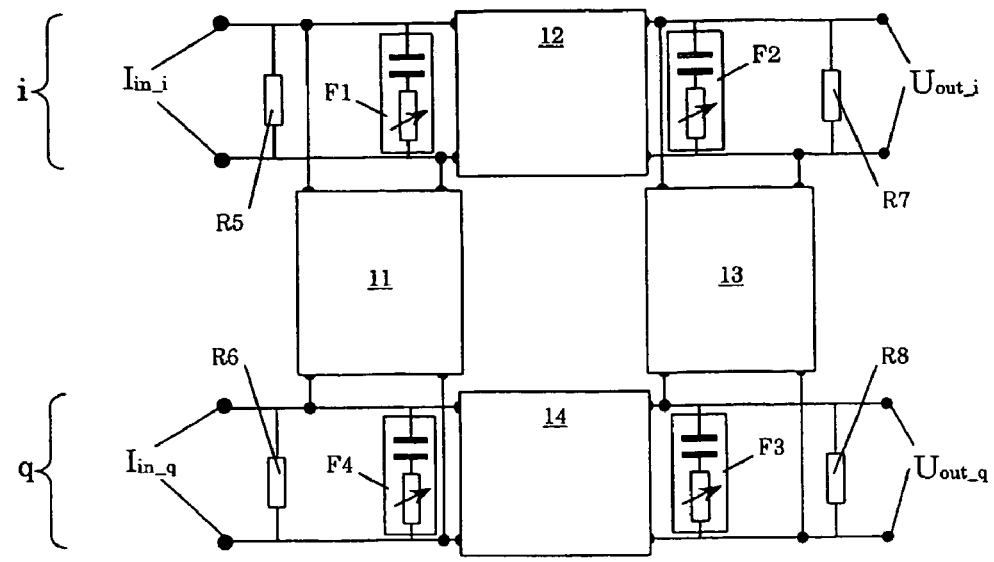
FIG. 8 shows an electric circuit of an example of an embodiment of a poly-phase filter device according to the invention.

FIG. 8 shows a poly-phase IF-filter. Nowadays it is becoming common practice to implement channel-selective (low-) IF filters or IF anti-aliasing filters on chip. In practice, the choice of a non-zero IF frequency in combination with quadrature mixers and a poly-phase IF-filter offers a great advantage over the traditional single-mixer plus IF-filter combination, in that it inherently suppresses the image-frequency. This complex-frequency processing topology avoids the need of a complicated image-rejection filter at RF-frequencies in front of the mixer. The level of image-frequency suppression depends ultimately on the accuracy of the quadrature oscillators and the matching between the in-phase and quadrature IF-branches. It should be noted that the filter of FIG. 8 is an example of a polyphase filter and that the invention may be applied in other types of polyphase filters.

The filter device in FIG. 8 has two branches i and q having a phase difference with respect to each other. In the shown example, the phase difference is supposed to be 90 degrees. The shown filter device has two in-phase input contacts $I_{in\_j}$ at which a signal is presented and two phase shifted input contacts $I_{in\_q}$ at which in this example the same signal but ±90 degrees phase shifted is presented. At in phase output contacts Uout_i an output signal is presented. The same output signal but ±90 degrees phase shifted is presented at the phase shifted output contacts Uout_q. Corresponding contacts are connected to each other via a resistor R5-R8 resp. The in-phase input contacts $I_{in\_j}$ are connected to the in-phase output contacts $U_{out\_i}$ via a gyrator device 12 and two phase shifter devices F1,F2. The gyrator device 12 may be similar to the gyrator device of FIG. 7. Both the input contacts and the output contacts of the gyrator device 12 are connected in parallel to an phase shifter device F1 resp. F2 comprising a capacitor and a resistor connected in series. The phase shifted input contacts $I_{in\_q}$ and phase shifted output contacts $U_{in\_q}$ are connected in a similar manner to a gyrator device 14 and phase shifters F3, F4. The in-phase branch i and the phase shifted branch q are connected to each other via gyrators 11,13 connected to the input contacts $I_{in\_i}$, $I_{in\_Q}$ resp. the output contacts $U_{out\_i}$, $U_{out\_q}$. The filter has an improved performance, because the gyrator devices with the phase shifters behave more like ideal inductors due to the, adjustable, phase compensation of the phase shifter sections F1-F4.

The shown filter device is especially suited for implementation in a single integrated circuit, because the only components required are transistors, resistors and capacitors. Furthermore, because the inductors are simulated using transistors and capacitors, the integrated circuit may be relatively small and have a low power consumption. Therefore the circuit is especially suited for applications with a limited power supply, such as mobile telephones and Bluetooth devices.

Figure 9:
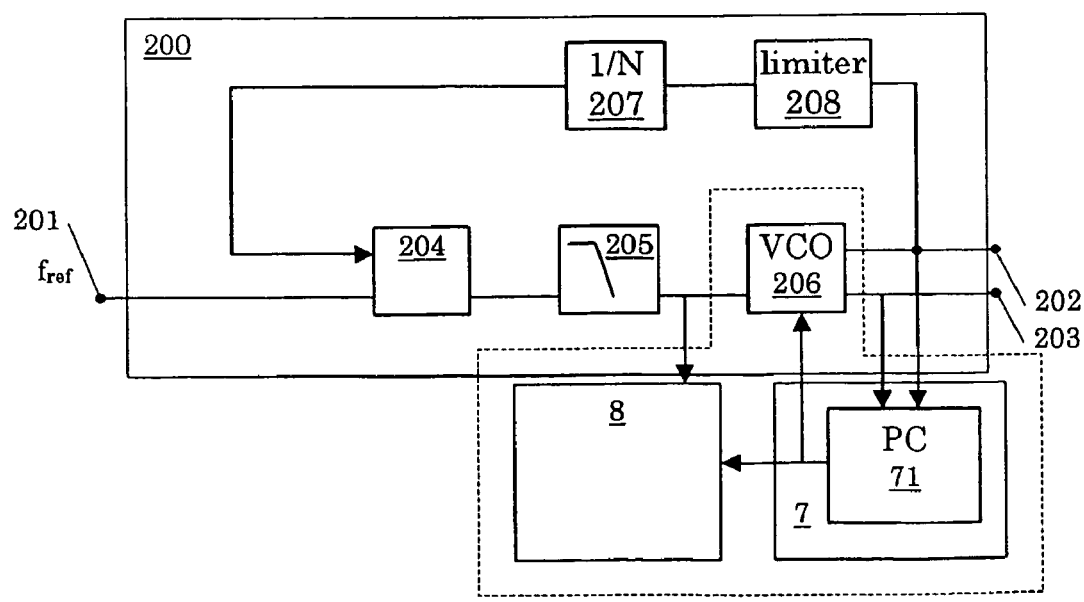
FIG. 9 shows a block diagram of a phase locked loop with an example of an automatic tuning system for an amplifier circuit according to the invention.

In practice, the frequency-dependence of the gain of the transconductor device may not be known accurately enough, for example because the behaviour is poorly modelled in a electronic circuit simulator. Also, the spread in device characteristics after the processing of an electronic circuit is usually large, so the behaviour of a specific device is complex to predict. In the circuit of FIG. 9, an automatic tuning system (ATS) is shown for matching the time constant of the adjustable resistor-capacitor circuit to the time constant $\tau$ of the transconductor device, thus obtaining an accurate correspondence between the time constants of the resistor-capacitor circuit and the transconductor device respectively. The elements which constitute the ATS are indicated with the dotted line. It should be noted that the shown ATS is just an example of a control system and other control systems may likewise be used to control the resistance of an adjustable resistor-in an amplifier circuit according to the invention.

The ATS of FIG. 9 is partly integrated in a phase locked loop (PLL) 200, as is generally known in the art. The PLL 200 has a PLL input 201 and a PLL output 202,203. The PLL 200 includes a phase detector 204, a low-pass filter 205, a voltage controlled oscillator (VCO) 206, a limiter device 208 and a frequency divider 207. At the PLL input 201 an input signal of a reference frequency ($f_{ref}$) may be presented. In that case, the PLL provides a VCO signal of output frequency ($f_{out}$) at the PLL outputs 202,203. At the PLL outputs 202,203 the VCO signal is presented, however there is a phase difference between the outputs. The VCO signal is generated by the VCO 206 based on a VCO input signal voltage. If the PLL 200 is in lock, the output frequency $f_{out}$ equals the reference frequency $f_{ref}$ multiplied with a division factor N:

$$f_{out} = N \cdot f_{ref}$$

The VCO output signal frequency $f_{out}$ is divided by the frequency divider 207 by the division ratio N. This results in a signal of a divided frequency $f_{div}$ which is equal to:

$$f_{div} = \frac{f_{out}}{N}$$

The signal with divided frequency $f_{div}$ is compared to the input signal of reference frequency $f_{ref}$ by phase detector 204. The phase detector 204 outputs a difference signal which is based on the difference in phase between the divided frequency $f_{div}$ and the reference frequency $f_{ref}$. The difference signal is low-pass filtered by filter 205 and used as the VCO input signal which controls the oscillation of the VCO 206.

The ATS in FIG. 9 comprises the voltage controlled oscillator device (VCO) 206 of the PLL. In general, a VCO is an oscillator device which generates a signal of a certain frequency which depends on a voltage applied at an input of the VCO. In FIG. 9 the VCO is a copy of a gyrator device as is used in the filter and may for example be a gyrator device as is shown FIG. 7. The amplifier circuit used in the VCO gyrator may be similar to the transconductor in the amplifier circuit which is to be controlled by the ATS.

In the example of FIG. 9, the output of the filter 205 is connected to transconductor devices, which are not shown, in an amplifier device 8 according to the invention. The output of the filter 205 thus controls the transconductance gain of the transconductor devices. The output of the filter 205 also controls the oscillation frequency of the VCO, for example of the VCO comprises a gyrator circuit according to the invention by controlling the gain of the transconductor devices in the gyrator. The output of the VCO 206 is connected to a phase compensation processor (PC) device 71, which provides an output signal which may be used to control the resistance of the adjustable resistor, e.g. by controlling the gain of the amplifier in the adjustable resistor. In the shown example, the output signal of the PC device 71 is also fedback to the VCO 206 to control the gain of the amplifier in the adjustable resistor in the gyrator acting as the VCO.

Instead of the amplifier circuit 8, a gyrator device or a poly-phase filter according to the invention may be controlled by the ATS. Furthermore, (parts of) the ATS may be combined with (parts of) the tuning-loop of a filter, such a tuning loop is usually already present in a filter device. Thereby the additional required power-consumption is minimised. Also the ATS may be stand-alone, that is not be partially integrated in the PLL An amplifier circuit in accordance with the invention or a IF-filter in accordance with the invention may advantageously be used in electronic devices for the reception of radio signals with a limited power supply. These electronic device may for example be battery powered radios, mobile telephones or device communicating via the Bluetooth protocol such as laptop computer communicating with a Local Area Network via a Bluetooth link or Personal Digital Assistants communicating to a computer via a Bluetooth link.

The invention claimed is:

1. An amplifier circuit, comprising:
   at least one transconductor device connected to at least one phase shifter section with an adjustable phase shift and an impedance at least partially dependent on the frequency of an input signal, wherein in use said adjustable phase shift is adjusted to have substantially the opposite value of a phase shift of said transconductor device, wherein said phase shifter section comprises at least one capacitor device and at least one adjustable resistor device, said adjustable resistor device comprises an amplifier device including:
      at least one input contact for receiving a resistance control signal;
      a first output contact connected to the at least one capacitor device; and
      a second output contact connected to said transconductor device; and,
      wherein said amplifier circuit further comprises a control device for providing said resistance control signal to said input contact.

2. The amplifier circuit as recited in claim 1, wherein component characteristics of said amplifier device in the adjustable resistor device are substantially equivalent to the component characteristics of said transconductor device.

3. The amplifier circuit as recited in claim 1, wherein said transconductor device is comprised of at least one transistor.

4. The amplifier circuit as recited in claim 3, wherein the at least one transistor is a Metal Oxide Semiconductor Field Effect Transistor.

5. The amplifier circuit as recited in claim 1, wherein said amplifier device in the adjustable resistor device is a transistor.

6. The amplifier circuit as recited in claim 1, wherein said control device comprises a voltage controlled oscillator.

7. The amplifier circuit as recited in claim 6, wherein the control device further comprises an amplifier.

8. The amplifier circuit as recited in claim 7, wherein the voltage controlled oscillator circuit comprises at least two oscillator transconductor devices substantially similar to said transconductor device.

9. An amplifier circuit, comprising: at least one transconductor device connected to at least one phase shifter section with an adjustable phase shift and an impedance at least partially dependent on the frequency of an input signal, wherein in use said adjustable phase shift is adjusted to have substantially the opposite value of a phase shift of said transconductor device; and at least one gyrator circuit having at least one transistor therein and having an input contact connected to an output contact of the transconductor device of said amplifier circuit, wherein said at least one transistor has a gain substantially the inverse of the gain of the a transistor in said amplifier circuit.

10. The amplifier circuit of claim 9, further comprising:
    a filter device comprising at least one in-phase input and at least one in-phase output, the at least one gyrator circuit coupled to said in-phase input and said in-phase output.

11. The filter device as recited in claim 10, further comprising:
    at least one phase shifted input coupled to the at least one gyrator device, and
    at least one phase shifted output coupled to the at least one said gyrator device.

12. The amplifier circuit as recited in claim 9, further comprising:
    a filter device comprising at least one in-phase input, at least one in-phase output, at least one phase shifted input, and at least one phase shifted output;
    at least a first gyrator device connected to said in-phase input and said phase shifted input; and
    at least a second gyrator device connected to said in-phase output and said phase shifted output.

13. A method for amplifying an input signal, comprising the steps of:
    generating a current signal based on a voltage of an input signal;
    adjusting a phase shift of a resistor device to substantially the opposite of a phase shift of said current signal generated in said generating step, said resistor device having an adjustable phase shift and an impedance at least partially dependent on the frequency of the input signal;
    presenting the current signal to a capacitor device; and
    presenting the current signal to said resistor device.

* * * * *

UNITED STATES PATENT AND TRADEMARK OFFICE
CERTIFICATE OF CORRECTION

PATENT NO. : 7,274,276 B2  Page 1 of 2
APPLICATION NO. : 10/516631
DATED : September 25, 2007
INVENTOR(S) : Eikenbroek It is certified that error appears in the above-identified patent and that said Letters Patent is hereby corrected as shown below:

Title Page, Item (73), "Assignee", delete "Telefonktiebolaget" and insert -- Telefonaktiebolaget --, therefor.

In Column 2, Line 20, delete "transconducor" and insert -- transconductor --, therefor.

In Column 2, Line 62, delete "Uin" and insert -- $U_{in}$ --, therefor.

In Column 2, Line 63, delete "Uout" and insert -- $U_{out}$ --, therefor.

In Column 2, Line 66, delete "Uout" and insert -- $U_{out}$ --, therefor.

In Column 3, Line 2, delete "Uout" and insert -- $U_{out}$ --, therefor.

In Column 3, Line 7, delete "I2" and insert -- $I_2$ --, therefor.

In Column 3, Line 8, delete "I2" and insert -- $I_2$ --, therefor.

In Column 5, Line 50, delete "$I_{in\_j}$" and insert -- $I_{in\_i}$ --, therefor.

In Column 5, Line 54, delete "Uout_i" and insert -- $U_{out\_i}$ --, therefor.

In Column 5, Line 56, delete "Uout_q" and insert -- $U_{out\_q}$ --, therefor.

In Column 5, Line 66, delete "$U_{in\_q}$" and insert -- $U_{out\_q}$ --, therefor.

In Column 6, Line 3, delete "Iin_Q" and insert -- $I_{in\_q}$ --, therefor.

In Column 6, Line 3, delete "$U_{out\_q}$" and insert -- $U_{out\_q}$ --, therefor.

In Column 7, Line 34, after "PLL" insert -- . --.

Signed and Sealed this

Thirteenth Day of July, 2010

David J. Kappos
*Director of the United States Patent and Trademark Office*

In Column 8, Line 30, in Claim 9, after "gain of" delete "the".